(12) United States Patent
Sabev

(10) Patent No.: US 7,691,276 B2
(45) Date of Patent: Apr. 6, 2010

(54) METHOD FOR MANUFACTURING AN ELECTRICAL CONNECTING ELEMENT, AND A CONNECTING ELEMENT

(75) Inventor: Pavlin Sabev, Zürich (CH)

(73) Assignee: Dyconex AG, Bassersdorf (CH)

( * ) Notice: Subject to any disclaimer, the term of this patent is extended or adjusted under 35 U.S.C. 154(b) by 1056 days.

(21) Appl. No.: 11/375,171

(22) Filed: Mar. 14, 2006

(65) Prior Publication Data
US 2006/0211191 A1  Sep. 21, 2006

(30) Foreign Application Priority Data
Mar. 16, 2005  (EP) .................. 05405246

(51) Int. Cl.
*H01B 13/00* (2006.01)
(52) U.S. Cl. .............. 216/19; 216/13; 216/17; 438/622
(58) Field of Classification Search .......... 216/13, 216/16, 17, 19, 20; 438/382, 384
See application file for complete search history.

(56) References Cited

U.S. PATENT DOCUMENTS

| 5,119,272 | A | * | 6/1992 | Ohyama et al. | ............. | 361/765 |
|---|---|---|---|---|---|---|
| 5,403,768 | A | | 4/1995 | Jeong et al. | | |
| 5,709,927 | A | | 1/1998 | Miyase et al. | | |
| 6,500,724 | B1 | | 12/2002 | Zurcher et al. | | |
| 7,323,762 | B2 | * | 1/2008 | Lai et al. | ............. | 257/536 |
| 2003/0150840 | A1 | | 8/2003 | Lillie et al. | | |
| 2003/0162386 | A1 | | 8/2003 | Ogawa et al. | | |
| 2004/0192039 | A1 | | 9/2004 | Su et al. | | |
| 2004/0238216 | A1 | * | 12/2004 | Jessep et al. | ............. | 174/262 |

FOREIGN PATENT DOCUMENTS

| WO | WO 95/03168 | 2/1995 |
|---|---|---|
| WO | WO 99/27759 | 6/1999 |

* cited by examiner

*Primary Examiner*—Lan Vinh
(74) *Attorney, Agent, or Firm*—Rankin, Hill & Clark LLP

(57) ABSTRACT

The method according to the invention is essentially characterised in that a resistance material (5)—for example nickel or a nickel alloy—is attached on a first structured conductor layer (2)—it may be of copper or a copper alloy. Subsequently, the first structured conductor layer (5) is removed again at least at those locations at which a resistor is to arise. This may be effected by way of firstly removing the insulating material (1) on which the first conductor layer adheres, firstly from the rear side at the desired locations for example by way of plasma etching. The conductor layer 2 my be subsequently removed at least in regions.

9 Claims, 3 Drawing Sheets

METHOD FOR MANUFACTURING AN ELECTRICAL CONNECTING ELEMENT, AND A CONNECTING ELEMENT

BACKGROUND OF THE INVENTION

The invention lies in the field of electrical connecting elements. Such electrical connecting elements are wiring systems for an arrangement of active and/or passive electrical or electronic components. Examples of electrical connecting elements are printed circuit boards, high density interconnects (HDIs), flex-prints, interposers etc. The invention specifically relates to electrical connecting elements with embedded resistors, as well as their manufacture.

Printed circuit boards, for example with electrical resistors embedded in a network-like manner are known. It is known for example to enclose a resistance layer in printed circuit board materials, from which a network of electrical resistors may be produced by way of selective etching. Such a resistance layer consists for example of a nickel alloy. However, there exists the problem of the absence of etching means selectivity, on etching the resistance layer or the copper layer which adheres thereto, via which the contacting of the resistors is effected. Furthermore, with known printed circuit board materials, a nickel layer bears directly on a plastic substrate layer. The adhesion properties of nickel alloys to plastic layers are, however, not very good. For this reason, the resistance layer may detach in unfavourable cases. Furthermore, due to manufacturing technology, only a limited thickness region is available, and one may not manufacture arbitrarily thin nickel layers for the mentioned printed circuit board materials.

For this reason, it is the object of the invention to provide a method for manufacturing electrical connecting elements, as well as an electrical connecting element, which overcomes the disadvantages according to the state of the art, and which in particular makes do without a large-surfaced transition between an insulator layer and a nickel layer.

BRIEF SUMMARY OF THE INVENTION

In accordance with the invention, a method for manufacturing an electrical connecting element or a semifinished product with at least one electrical resistor is provided, the method comprising the following method steps:
a. providing a starting product with an electrically insulating layer and a first conductor layer of a first conductor material adhering thereto on a first side;
b. structuring the first conductor layer;
c. attaching a resistance material on the structured first conductor layer;
d. removing the first conductor material at those locations at which the at least one electrical resistor is to be formed.

Thus, in accordance with this method, a resistance material, for example nickel or a nickel alloy, is attached on a first structured conductor layer, which may consist of copper or a copper alloy. The first structured conductor layer is subsequently removed at least at those locations on which a resistor is to arise. This may be effected by way of removing the insulating material on which the first conductor layer adheres at the desired locations, firstly from a rear side, for example by way of the plasma etching method. The first conductor layer may be subsequently removed at least in parts.

The attachment of the resistance material on the first conductor material may be effected in a surface-selective manner, i.e. the resistance material only attaches to the first conductor material, but not to free-lying surfaces of the insulating material. Methods already exist which permit this. A particularly preferred variant is autocatalytic deposition, such as is known per se for nickel on gold. A further possibility is galvanic deposition of a resistance material on the first conductor material, wherein the structures of the first conductor material are then selected such that they are electrically contactable at the desired locations.

The structured first conductor layer according to the above concept serves at least in regions as a "track layer": It determines where the resistors are to later run, and is at least partly removed again after the attachment of the resistance material.

In contrast to the state of the art therefore, the second conductor material (the resistance material, for example the nickel or the nickel alloy) is attached to a structured conductor layer selectively. From the very beginning, a layer of the resistance material forms only at desired locations. After depositing the layer system on a carrier, by way of bonding/laminating for example, a transition between the plastic and the resistance material, therefore, exists only at these desired locations. For this reason, adhesive properties of the resistance material which are not very favourable, do not play any role or only an insignificant one.

In order to provide the construction with mechanical stability when the insulating layer is locally removed, the layer system after the structuring of the conductor layer and the attachment of the resistance material, but before the removal of the insulating material, is preferably fastened on a carrier such that the side with the structured conductor layer and with the attached resistance material lies on the carrier. The carrier does not need to be continuous in a large-surfaced manner, but in this embodiment however it should be present at least where the resistors are to arise. The carrier is preferably stiff in shape, or has stiff sections where the arising resistors lie. This permits the use of resistance materials which do not adhere to bending substrates. The carrier for example may be manufactured of fiber-reinforced material.

After the insulating material and the first conductor material has been removed at the desired locations, the second conductor material, the resistance material, lies free towards one side, like in "windows" in the insulating material. This permits a laser-assisted resistance value matching. The width of a transition portion of the resistor (i.e. of the section between end portions which makes up the actual resistance and is mostly elongately narrow), is reduced at one or more locations in a targeted manner by way of a laser beam, until a desired resistance value is reached.

The method according to the invention, in contrast to the state of the art however, also permits the resistance value to be influenced in a targeted manner by way of the thickness of the resistance material. There is not a very small quantity of fixed resistance film thicknesses available from which one may select, but the thickness of the resistance layer may be selected in a wide range. An electrical connecting element may also (for example in the same layer) comprise electrical resistors of a different thickness. This may be accomplished by way of mask technology. In a first step, resistance material is attached on the structured conductor layer up to a certain first thickness. The mask is subsequently deposited, which covers parts of the structured conductor layer, whereupon resistance material is again attached up to a second thickness. This procedure may be repeated in order to produce resistors of the most varied of thicknesses.

An electrical connecting element or semifinished product according to the invention has a layered construction with conductor structures on a first conductor material (mostly copper), and at least one embedded resistor of a resistance material. It differs from the known state of the art by way of the fact that the resistor is formed by a structured layer of the resistance material, which is formed in the layered construction between two insulating layers.

"Formed in the layered construction between two insulating layers" does not mean that the layer with the resistance material needs to be embedded completely between the layers. On the contrary, as is deduced from the above description of the manufacturing method, the first insulating layer in the manufacturing method is preferably removed locally where the resistor lies. Rather, it is meant that the resistance material adheres to an electrically insulating layer, said layer in the layered construction adhering on a further, electrically insulating layer in a flat manner, thus for example, over a whole region of the connecting element or over the whole connecting element, wherein the border surface between the two insulating layers is interrupted only locally (in particular in the vicinities of the resistor/resistors).

The resistance material preferably partly envelops first conductor material at end portions of the resistor/resistors. This is achieved by way of not removing the first conductor material serving as a track layer, in the region of the end portion in the manufacturing method. This feature entails the advantage that a reliable contacting of the resistor by way of vias becomes possible due to this. If copper is selected as a first material and as a via material, the resistor is contacted via a reliable Cu—Cu connection.

As an alternative to contacting by way of vias, the resistor may also be contacted by way of conductor paths which are arranged in the same layer. For example, the first conductor layer in the manufacturing method may serve as a track layer only in regions, and form a conventional conductor path structure in other regions. These other regions may, for example, be covered in a suitable manner during the deposition of resistance material.

The invention according to another aspect also concerns a method for manufacturing an electrical connecting element with at least one electrical resistor, comprising the following steps:

a. providing a starting product with an electrically insulating layer and a first conductor layer of a first conductor material adhering thereto on a first side and a second conductor layer on a second side;
b. structuring the first conductor layer and the second conductor layer;
c. adding a resistance material to the structured first conductor layer;
d. affixing a layered system resulting system resulting therefrom onto a carrier before the method step d., wherein the first side of the electrically insulating layer faces the carrier;
e. selectively removing the insulating layer in a vicinity of those locations at which the at least one electrical resistor is to arise, so that at least one recess is created; and
f. removing the first conductor material lying open in said at least one recess;
g. whereby said at least one resistor is formed by resistance material in said at least one recess.

Further, the invention also concerns an electrical connecting element or semifinished product with a layered construction with conductor structures of a first conductor material and with at least one embedded resistor, wherein the resistor is formed by a structured layer from a resistance material, wherein the connecting element or semifinished product at least in regions comprises a first insulating layer and a second insulating layer adhering thereto, and the structured layer of the resistance material, in the layered construction, is located between the first and the second insulating layer.

BRIEF DESCRIPTION OF THE DRAWINGS

Embodiments of the method according to the invention are hereinafter described by way of the drawings. In the drawings there are shown in.

DETAILED DESCRIPTION OF THE INVENTION

Figure 1:
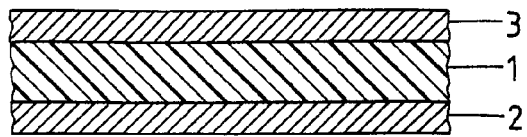
FIG. 1 a starting product, specifically an electrically insulating layer coated on both sides with copper, in a longitudinal section, FIG. 2 the starting product after a pre-processing step, FIG. 3a the product after a structuring, FIG. 3b a structure of the first layer in a plan view, FIG. 4 an arrangement of two products according to FIG. 3a during the coating with a resistance material, FIG. 5 the product after the coating with the resistance material, laminated onto a carrier, FIG. 6 the product after the formation of the vias, FIGS. 7a and 7b the removal of the electrically insulating layer, FIG. 8 the structuring of the second conductor layer following this, FIG. 9 the formed structure after the selective etching-out of the copper, in a cross section, and FIG. 10 a flowchart summarizing method steps of FIGS. 1 through 9.

The starting product drawn in FIG. 1 may, for example, be a commercially obtainable product known per se. It may be a polyimide-, epoxide-, PET-, PEEK-, PES- or LCP-film. Basically, any insulating material generally provided with a first conductor material on both sides is suitable. The film 1 in the following is also indicated as an "insulating layer", the lower copper lamination 2 as a first conductor layer, and the upper copper lamination 3 as a second conductor layer.

Figure 2:
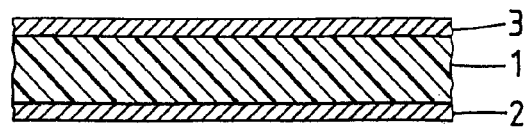

In an optional first method step, conductor material is, for example, removed from both conductor layers (Cu-reduction), in order to achieve a desired conductor thickness, as is shown in FIG. 2. The optimal conductor thickness depends on the application. The method according to the invention, however, also permits work with relatively thick conductor layers of between 10 μm and 50 μm, preferably between 20 μm and 40 μm. This is advantageous since the conductor paths which conduct current do not have to be wide, and may conduct relatively large currents.

Figure 3A:
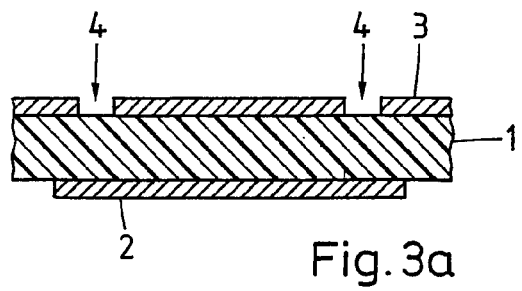
Figure 3B:
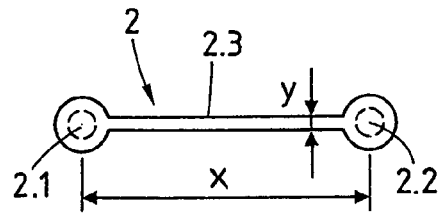

The first and the second conductor layer are structured in a first structuring step, which is represented in FIGS. 3a and 3b. The first conductor layer 2 thereby receives conductor paths at those locations at which a resistor is later to arise. A corresponding conductor path is shown in FIG. 3b in a plan view. The conductor path has two end portions 2.1, 2.2 and a transition portion 2.3. The first conductor layer may comprise conductor paths of different shapes and configurations, for example in different lengths (x) and widths (y). It may also have a shape which is bent at an angle or meandering, or which is otherwise complicated. According to a special embodiment, the conductor paths, and as a consequence, the resistors arising later, are arranged in a regular grid pattern. Other embodiments envisage the conductor paths being arranged in a certain pattern which is dependent on application. For example, a resistor network which is designed to match the configuration of the integrated circuit may be manufactured for an electrical connecting element serving as an "interposer" (connecting element for contacting a complex, integrated circuit "chip").

The first conductor layer, apart from conductor paths for a later preparation of resistors, may also contain other structures, for example, application-specific or grid-pattern-like conductor path structures in sections, said structures serving as conductor connections in the conventional manner, or two-dimensional structures which together with corresponding structures in an adjacent layer, form a capacitative element.

The second conductor layer 3 in the first structuring step, for example, is provided with openings 4 at those locations at which vias are to arise. Depending on the technology for the production of the vias, the first structuring step for the second conductor layer may also be done away with completely, for example if the vias are mechanically drilled.

Figure 4:
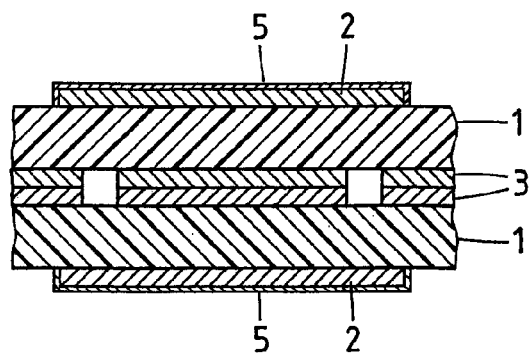

In a next method step represented in FIG. 4, the structured first conductor layer 2 is provided with a resistance material, specifically with a Ni—P alloy. During this coating step, the second conductor layer 3 is covered in a suitable manner, so that it remains free of nickel. This as represented, may be effected in that two examples of the product according to FIG. 3a are slightly pressed onto one another, and specifically in an arrangement in which the first conductor paths bear on one another. Alternatively to this, the second conductor layer may also be protected in another manner, for example by way of attaching easily adhering, film which may be subsequently easily removed again, by way of pressing onto a surface of an auxiliary element, etc.

The coating step is effected such that the resistance material 5 only adheres to the first conductor material but not to plastic surfaces which lie free. According to a preferred embodiment, the coating with the resistance material is effected in an autocatalytic manner. Nickel may be autocatalytically deposited from a bath which contains dissolved nickel ions. Corresponding methods are known for example from the manufacture of Au/Ni end layers on printed circuit boards of mobile telephones, and here is not dealt with in more detail. The product marketed under the trade name Duraposit of the company Shipley or another suitable chemical product may for example be used for the bath. The resistance material deposited in such a method, apart from the nickel, also contains phosphorus in quite large concentrations. This per se is advantageous, since the resistance material indeed should form a resistor: the larger the surface resistance the better. The attachment of the resistance material may also be effected galvanically as an alternative to the described autocatalytic process.

The thickness of the arising nickel layer may be controlled through time during which the nickel is deposited. It may for example be between 2 µm and 5 µm. It may also be thicker than 5 µm or even thinner than 2 µm.

Figure 5:
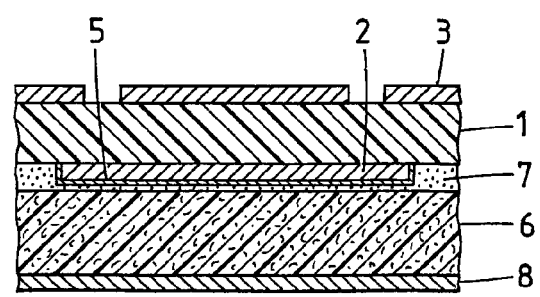

Subsequently the formed product is laminated (adhesive layer 7) onto a carrier 6. This step is represented in FIG. 5. In the shown example, the carrier is a fiber composite plate laminated with copper on one side (prepeg: the reference numeral 8 indicates the copper layer). It may however also be any other element which may support the conductor layers in subsequent processing steps, for example a differently assembled plate or film, a premanufactured conductor plate, a heat sink, etc.

The carrier need not be extended over the complete surface of the arising electrical connecting element. In the embodiment shown here, it is merely required at the locations of the resistors. It may be omitted therebetween, so that the electrical connecting element may have flexible and stiff sections.

According to a preferred embodiment, the carrier 6 is stiff at least in sections (as is the case with a fiber composite plate).

It is then ensured that the resistance material may not detach or break on account of bending of the carrier. So-called flexible nickel or another resistance material is used in other embodiments, which withstand a bending of the substrate. The carrier in this embodiment may be of completely supple material ("full-flex").

Figure 6:
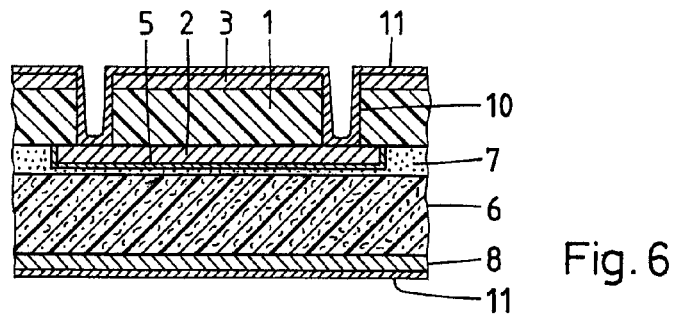

Vias 10 are manufactured from the second conductor layer subsequent to the depositing of the product onto the carrier. This step is represented in FIG. 6. The manufacture of vias may be effected in many manners, for example by way of laser drilling, mechanical drilling, piercing or hole manufacture by way of plasma etching, and the subsequent chemical deposition of a contacting copper layer 11, etc. The vias 10 may possibly also be produced before depositing onto the carrier, for example with the ALIVH-technique (any layer interstitial via holes) which has been developed by the company Matushita.

Figure 7A:
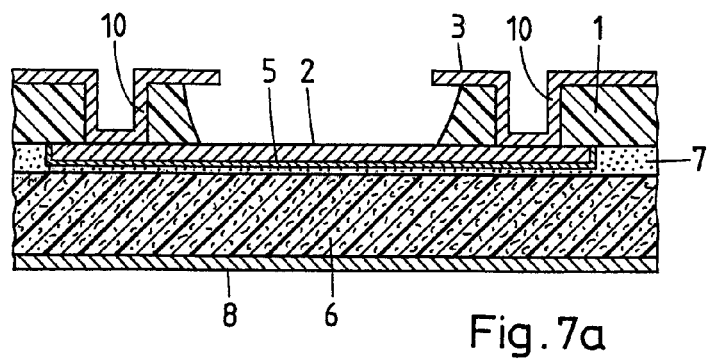
Figure 7B:
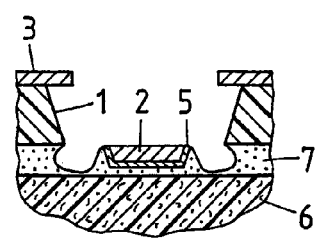

As a further step, the insulating layer 1 is removed selectively at those locations at which the resistance material 5 is to form an embedded electrical resistor. For this purpose, firstly the second conductor layer 3 is removed at the mentioned locations. Subsequently, as is shown in FIGS. 7a and 7b, the insulating material is removed in an etching method, for example in a plasma etching method. In this etching method, the second conductor layer 3 serves as a mask, i.e. the copper is not attacked. Such a plasma etching method is known and documented for example under the tradename Dycostrate®. The locations at which the insulating material is etched away, thereby must be selected such that the through-contacts are not touched: the first conductor material is to remain there and permit a contacting of the resistor from the adjacent layer. The corresponding end portions 2.1, 2.2 serving for the contacting are drawn widened in FIG. 3b. By way of this, the first conductor material remaining at the end portions, quasi has the effect of a contacting layer: the through-contacts result in an electrical contract between two layers of the first conductor material (thus for example in a Cu—Cu contact). As is known, such a contact may be manufactured with a high reliability. For reasons of a clear representation in FIG. 7a, the vias 10 are represented somewhat wider than in the previous Figs., furthermore the two copper layers 3, 11 are no longer different.

One may see the rear etchings which are typical of the plasma etching method, in the sectioned representation of FIG. 7a and the perpendicular representation in FIG. 7b which shows a section perpendicular to the longitudinal axis of the resistor. The plasma etching method is carried out until the first insulating layer is completely removed. The fiber-reinforced carrier material is not attacked by the plasma etching method.

Figure 8:
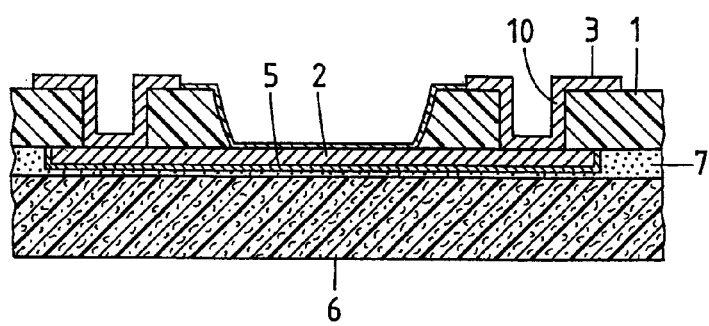

FIG. 8 shows the product after the next step, specifically after the structuring of the first conductor layer. The copper layer 8 on the carrier may also be structured and contain a conductor path pattern. There may also be through-contacts from the second conductor layer 3 or possibly from the first conductor layer 2 to this copper layer 8, the third conductor layer. These may for example be manufactured by way of mechanical drilling or by way of laser drilling or with any other suitable technique.

Figure 9:
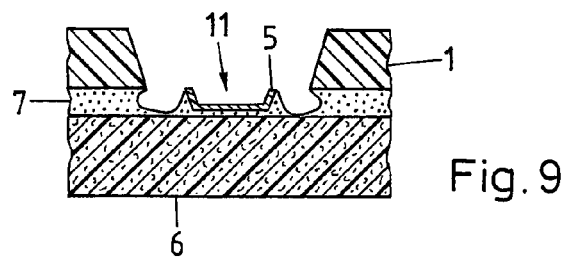

Simultaneously or subsequently, the material of the first conductor layer that now lies free, is removed at those locations at which the insulating material has been removed. In this procedure, one uses an etching agent which only attacks the first conductor material (copper), but not the second conductor material (i.e. the resistance material, here nickel). Such an etching agent is obtainable for example as an alkaline etching agent based on ammonium nitrate. During this method step, the (possibly already structured) material of the second conductor layer must be suitably protected, for example by way of photoresist. If the partial removal of the second conductor layer is combined with the structuring according to FIG. 8, this is accomplished by the photoresist layer which is deposited on the second conductor layer 3 for the structuring. A cross section through a location with etched-away conductor material is shown in cross section in FIG. 9. A trough-like structure 11 of resistance material 5 remains.

The resistors, when required, may subsequently be trimmed in a manner known per se. The resistance value is increased by way of laterally scoring the resistor (for example the transition portion 2.3 making up the actual resistance) at a desired number of locations with a laser cutting tool. Any number of further insulator conductor layer sequences may be laminated onto the now resulting product, or fastened in any other manner, and provided with vias, so that a multi-layered electrical connecting element arises in a manner known per se. Further layers may be provided with a resistor network in the manner described here.

The nickel which lies free, may be provided with a corrosion protection layer, for example with a screen printing method. A chemically deposited Ni/Au coating may be effected on envisaged contact locations in a manner known per se.

The method described above relates to an electrical connecting element (printed circuit board, interposer, HDI etc.) with at least one resistor. With the described method according to the invention, one may however also manufacture a product (semifinished product) which comprises a certain network of resistors—for example arranged in a grid-pattern-like manner, and be further processable into an electrical connecting element. For the manufacture of such, the step of the structuring of the second conductor layer 3 shown in FIG. 8 is not necessary. Instead of this, the product shown in the FIGS. 7a and 7b may also be used as a semifinished product with through-contacts to the resistors, and be completed by the end consumer. The resistors of the semifinished product may optionally comprise a corrosion protective layer. The window with the locally removed insulating layer 1 may be optionally filled.

Figure 10:
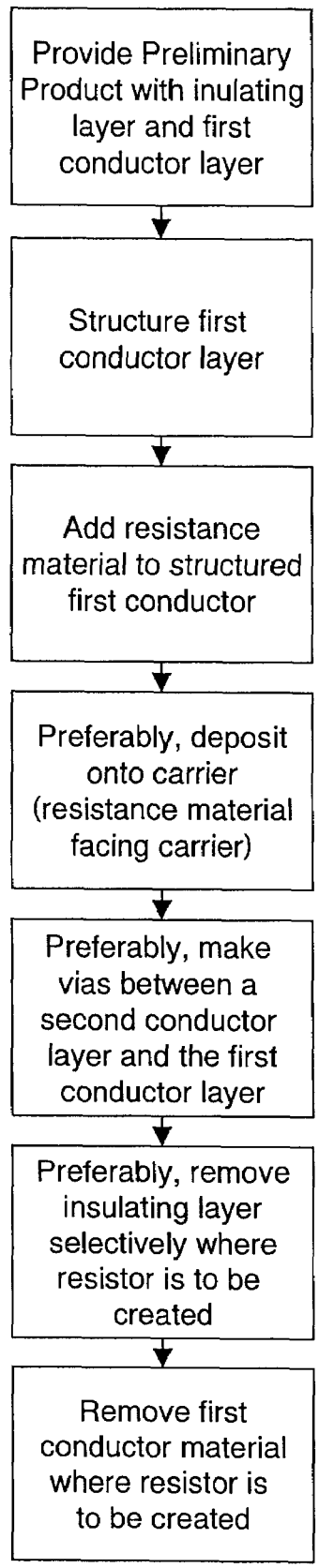

FIG. 10 summarizes some of the above-described method steps in a flowchart.

The previously described method and the product resulting therefrom are mere examples for the implementation of the invention. Various other embodiments may be envisaged without departing from the scope and spirit of the invention.

What is claimed is:

1. A method for manufacturing an electrical connecting element or a semifinished product with at least one electrical resistor, comprising the following method steps:
   a. providing a starting product with an electrically insulating layer and a first conductor layer of a first conductor material adhering thereto on a first side;
   b. structuring the first conductor layer;
   c. attaching a resistance material on the structured first conductor layer in a surface-selective manner so that the resistance material only attaches to the first conductor material and not to free-lying surfaces of the insulating material;
   d. after attaching the resistance material, removing the first conductor material at those locations at which the at least one electrical resistor is to be formed.

2. The method according to claim 1, wherein a second structured conductor layer is present or produced on a second side of the insulating layer, and wherein the method includes the further step of contacting the resistor or the resistors from the second structured conductor layer by way of vias, said further step being carried out at any stage after method step a.

3. The method according to claim 1, wherein a layer system of electrically insulating material, the structured conductor layer and resistance material is affixed to a carrier before the method step d., such that the first side of the electrically insulating layer faces the carrier.

4. The method according to claim 3, wherein after the affixing onto a carrier and before the method step d., the insulating layer is selectively removed in a vicinity of those locations at which the resistor is to arise or the resistors are to arise.

5. The method according to claim 4, wherein the selective removal of the insulating layer is effected with a plasma etching method.

6. The method according to claim 3, wherein after the affixing onto a carrier and before the method step d., the insulating layer is selectively removed in a vicinity of those locations at which the resistor is to arise or the resistors are to arise, and wherein the starting product comprises a second conductor layer adhering on the second side of the insulating layer, and wherein this second conductor layer is prestructured before the selective removal of the insulating layer and serves as a mask with the selective removal of the insulating layer.

7. The method according to claim 6, wherein the second conductor layer after the selective removal of the insulating layer, is structured such that a conductor path pattern arises.

8. A method for manufacturing an electrical connecting element with at least one electrical resistor, comprising the following steps:
   a. providing a starting product with an electrically insulating layer and a first conductor layer of a first conductor material adhering thereto on a first side and a second conductor layer on a second side;
   b. structuring the first conductor layer and the second conductor layer;
   c. adding a resistance material to the structured first conductor layer in a surface-selective manner so that the resistance material only attaches to the first conductor material and not to free-lying surfaces of the insulating layer;
   d. affixing a layered system resulting therefrom onto a carrier, wherein the first side of the electrically insulating layer faces the carrier;
   e. after the method step d, selectively removing the insulating layer in a vicinity of those locations at which the at least one electrical resistor is to arise, so that at least one recess is created; and
   f. after steps c, d, and e, removing the first conductor material lying open in said at least one recess;
   g. whereby said at least one resistor is formed by resistance material in said at least one recess.

9. The method according to claim 8 comprising the additional step of producing, after method step d., via contacts between selected locations of the second layer and selected locations of the first layer.

* * * * *

UNITED STATES PATENT AND TRADEMARK OFFICE
CERTIFICATE OF CORRECTION

PATENT NO. : 7,691,276 B2 Page 1 of 1
APPLICATION NO. : 11/375171
DATED : April 6, 2010
INVENTOR(S) : Sabev It is certified that error appears in the above-identified patent and that said Letters Patent is hereby corrected as shown below:

On the Cover Page, item (57), under "ABSTRACT", in Column 2, Line 10, delete "my" and insert -- may --.
In Fig. 10, Sheet 3 of 3, Box 1, in Line 2, delete "inulating" and insert -- insulating --.

Signed and Sealed this

Twenty-second Day of June, 2010

David J. Kappos
*Director of the United States Patent and Trademark Office*